US012716944B2

(12) United States Patent
Policke et al.

(10) Patent No.: US 12,716,944 B2
(45) Date of Patent: Aug. 25, 2026

(54) INTEGRATED CIRCUIT INCLUDING CONSTANT-0 FLIP FLOPS RECONFIGURED TO PROVIDE OBSERVABLE AND CONTROLLABLE TEST POINTS

(71) Applicant: QUALCOMM Incorporated, San Diego, CA (US)

(72) Inventors: Paul Policke, Cedar Park, TX (US); Shwetha Shivashankar Murthy, Pflugerville, TX (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 18/909,760

(22) Filed: Oct. 8, 2024

(65) Prior Publication Data

US 2025/0027993 A1 Jan. 23, 2025

Related U.S. Application Data

(62) Division of application No. 18/159,486, filed on Jan. 25, 2023, now Pat. No. 12,130,330.

(51) Int. Cl.
*G01R 31/3185* (2006.01)
*G01R 31/3177* (2006.01)

(52) U.S. Cl.
CPC ................ *G01R 31/318541* (2013.01); *G01R 31/318538* (2013.01); *G01R 31/3177* (2013.01)

(58) Field of Classification Search
CPC ................ G01R 31/318541; G01R 31/318538
See application file for complete search history.

(56) References Cited

U.S. PATENT DOCUMENTS 5,416,784 A * 5/1995 Johnson ......... G01R 31/318541 714/733
5,450,414 A * 9/1995 Lin ................ G01R 31/318586 714/724
5,615,217 A * 3/1997 Horne ............ G01R 31/318558 714/727
5,768,289 A * 6/1998 James ............ G01R 31/318586 714/727
5,903,466 A * 5/1999 Beausang ........ G01R 31/31716 716/134
5,983,377 A * 11/1999 Knotts ........... G01R 31/318572 714/724
7,183,789 B2 * 2/2007 Whetsel ........... G01R 31/31926 324/762.03
9,188,640 B1 * 11/2015 Jajodia ........... G01R 31/318541
9,297,855 B1 * 3/2016 Jindal ................ G01R 31/3177

(Continued)

*Primary Examiner* — Joseph D Torres
(74) *Attorney, Agent, or Firm* — Loza & Loza LLP

(57) ABSTRACT

An integrated circuit (IC), includes: a data path; a logic gate including a first input coupled to the data path, and a second input configured to receive a second input configured to receive a test data register (TDR) signal; and a first flip-flop including a data input coupled to an output of the logic gate. Another integrated circuit (IC), includes: a first logic gate including a first input configured to receive a test data register (TDR) signal; a first flip-flop including a data input (D) coupled to an output of the first logic gate, and a data output (Q) coupled to a second input of the first logic gate; a first data path; and a second logic gate including a first input coupled to the data output of the first flip-flop and a second input coupled to the first data path.

10 Claims, 5 Drawing Sheets

(56) References Cited

U.S. PATENT DOCUMENTS

2001/0052096 A1* 12/2001 Huijbregts ....... G01R 31/31721 714/726
2003/0034795 A1* 2/2003 Otto ............... G01R 31/318541 326/16
2003/0149924 A1* 8/2003 Bedal ............. G01R 31/318541 714/726
2005/0081130 A1* 4/2005 Rinderknecht .............................. G01R 31/318547 714/724
2005/0212542 A1* 9/2005 Brown ............. G01R 31/31715 324/750.3
2009/0132879 A1* 5/2009 Gangappa ...... G01R 31/318572 714/E11.155
2014/0189453 A1* 7/2014 Gurumurthy .. G01R 31/318541 714/726
2024/0248136 A1 7/2024 Policke

* cited by examiner

INTEGRATED CIRCUIT INCLUDING CONSTANT-0 FLIP FLOPS RECONFIGURED TO PROVIDE OBSERVABLE AND CONTROLLABLE TEST POINTS

CROSS-REFERENCE TO RELATED APPLICATIONS

The present Application for Patent is a Divisional of pending U.S. Non-Provisional application Ser. No. 18/159,486, filed Jan. 25, 2023, and assigned to the assignee hereof and hereby expressly incorporated by reference herein as if fully set forth below and for all applicable purposes.

FIELD

Aspects of the present disclosure relate generally to integrated circuits (ICs), and in particular, to an IC including one or more constant-0 flip-flops (F/Fs) reconfigured to provide additional observable and controllable test points.

BACKGROUND

Random pattern resistant faults (e.g., stuck-at-1 and stuck-at-0 faults) in integrated circuits (ICs) typically have lower detection probabilities, and consequently, cause a reduction of fault/test coverage in ICs. Electronic design automation (EDA) includes tools with test point analysis algorithms that are able to create dedicated sequential registers or flip-flops (F/Fs) along with combinational logic to detect such random pattern resistant faults. However, a drawback of this approach is that the additional dedicated sequential F/Fs can significantly impact IC footprint.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes a data path; a logic gate including a first input coupled to the data path, and a second input configured to receive a test data register (TDR) signal; and a first flip-flop including a data input coupled to an output of the logic gate.

Another aspect of the disclosure relates to a method of operating an integrated circuit (IC). The method includes coupling a data path to a data input (D) of a flip-flop in response to an asserted test data register (TDR) signal; and transferring a data on the data path from the data input (D) to a scan out (Sout) port of the flip-flop in response to a clock signal.

Another aspect of the disclosure relates to an integrated circuit (IC). The IC includes a first logic gate including a first input configured to receive a test data register (TDR) signal; a first flip-flop including a data input (D) coupled to an output of the first logic gate, and a data output (Q) coupled to a second input of the first logic gate; a first data path; and a second logic gate including a first input coupled to the data output of the first flip-flop and a second input coupled to the first data path.

Another aspect of the disclosure relates to a method of operating an integrated circuit (IC). The method includes feeding back an asserted control signal from a data output (Q) of a flip-flop to a data input (D) of the flip-flop via a first logic gate in response to an asserted test data register (TDR) signal; and providing the asserted control signal to a second logic gate to couple a first data path to a second data path.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, wellknown structures and components are shown in block diagram form in order to avoid obscuring such concepts.

Random pattern resistant faults (e.g., stuck-at-1 and stuck-at-0 faults) in integrated circuits (ICs) typically have lower detection probabilities, and consequently, cause a reduction of fault/test coverage in the ICs. Electronic design automation (EDA) typically includes tools with test point analysis algorithms that are able to create dedicated sequential registers or flip-flops (F/Fs) along with combinational logic to detect such random pattern resistant faults. However, a drawback of this approach is that the additional dedicated sequential F/Fs can significantly impact IC footprint.

Figure 1:
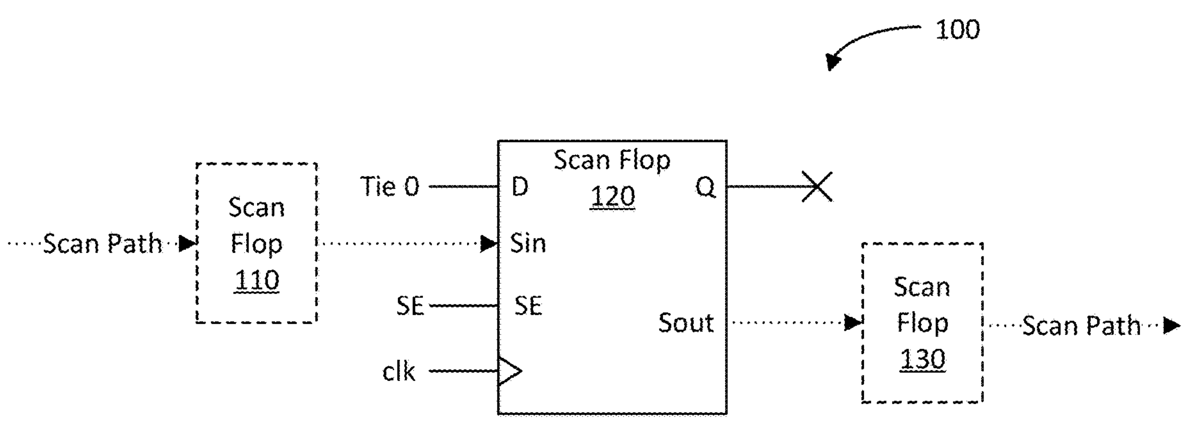
FIG. 1 illustrates a block diagram of an example integrated circuit (IC) including a single-bit, constant-0 flip-flop (F/F) in accordance with an aspect of the disclosure.

FIG. 1 illustrates a block diagram of an example integrated circuit (IC) 100 in accordance with an aspect of the disclosure. The IC 100 includes a single-bit, constant-0 flip-flop (F/F) 120 (e.g., also referred to as a "scan flop" or "sequential element"). The F/F 120 is referred to as a "constant-0" F/F because the functional path associated with the F/F 120 is disabled. In this regard, the F/F 120 includes a data input (D) tied to a logic "0" (but could alternatively be tied to a logic "1"). Accordingly, the F/F 120 may also be referred to as a constant-x F/F, where x is a bit value (e.g., a logic 0 or a logic 1) that is constant at the data input (D) of the constant-x F/F 120. The constant-0 F/F 120 includes a data output (Q) that is unconnected (e.g., not connected to a functional circuit or logic), as indicated by the X at the end of a metal line extending from the data output (Q).

The constant-0 F/F 120 is placement aware and is part of a scan chain or path of the IC 100. For instance, the IC 100 includes a scan flop or F/F 110 preceding the constant-0 F/F 120 along a scan path. That is, the preceding F/F 110 includes a scan output (Sout) port coupled to a scan input (Sin) port of the constant-0 F/F 120. Similarly, the IC 100 may include a scan flop or F/F 130 following the constant-0 F/F 120 along the scan path. That is, the constant-0 F/F 120 includes an Sout port coupled to an Sin port of the following F/F 130.

As discussed further herein, the constant-0 F/F 120 may be reconfigured to provide an additional observable or controllable test point (TP) for an otherwise unobservable data path. As the constant-0 F/F 120 may already exist in the IC design, reconfiguring the constant-0 F/F 120 does not significantly impact the IC footprint.

Figure 2:
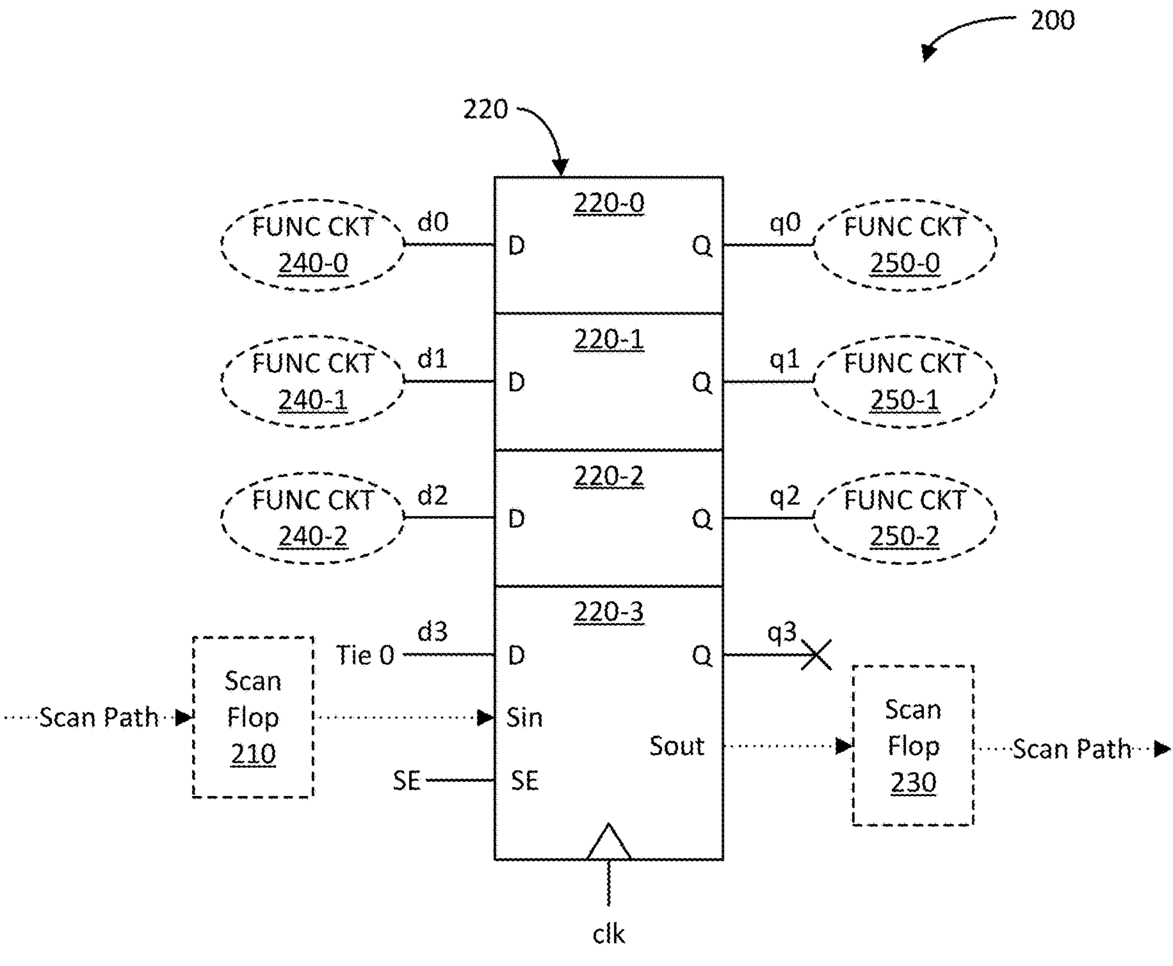
FIG. 2 illustrates a block diagram of an example integrated circuit (IC) including a flop tray with at least one constant-0 flip-flop (F/F) in accordance with another aspect of the disclosure.

FIG. 2 illustrates a block diagram of another example integrated circuit (IC) 200 in accordance with another aspect of the disclosure. The concept alluded to above regarding reconfiguring a single-bit, constant-0 F/F to provide an additional observable or controllable test point (TP) may also be extended to one or more constant-0 (or constant-x) flip-flops (F/Fs) of a flop tray.

The IC 200 includes a flop tray 220 including a set of four (4) F/Fs 220-0 to 220-3 (although, it shall be understood that the flop tray 220 may have a different number (more or less) of F/Fs). In this example, three (3) of the F/Fs 220-0 to 220-2 are used in functional mode, and one (1) F/F is a constant-0 F/F 220-3. It shall be understood that the flop tray 220 may include more than one constant-0 F/F. The functional F/Fs 220-0 to 220-2 include data inputs (D) coupled to functional circuits (e.g., logic) 240-0 to 240-2, respectively. The functional F/Fs 220-0 to 220-2 also include data inputs (Q) coupled to other functional circuits (e.g., logic) 250-0 to 250-2, respectively.

The constant-0 F/F 220-3 of the flop tray 220 includes a data input (D) tied to a logic "0" (but could also be tied to a logic "1" as previously discussed with reference to F/F 120, and may be referred to as more generally as a constant-x F/F). The constant-0 F/F 220-3 includes a data output (Q) that is unconnected (e.g., not connected to a functional circuit or logic), as indicated by the X at the end of a metal line extending from the data output (Q).

The flop tray 220 is placement aware and is part of a scan chain or path of the IC 200. For instance, the IC 200 may include a scan flop or F/F 210 preceding the flop tray 220 along a scan path. That is, the preceding F/F 210 includes a scan output (Sout) port coupled to a scan input (Sin) port of the flop tray 220. Similarly, the IC 200 may include a scan flop or F/F 230 following the flop tray 220 along the scan path. That is, the flop tray 220 includes an Sout port coupled to an Sin port of the following F/F 230.

Similar to the single-bit, constant-0 F/F 120, the constant-0 F/F 220-3 of the flop tray 220 may be reconfigured to provide an additional observable or controllable test point (TP) for an otherwise unobservable data path. As the flop tray 220 may already exist in the IC design, reconfiguring the constant-0 F/F 220-3 of the flop tray 220 does not significantly impact the IC footprint.

Figure 3:
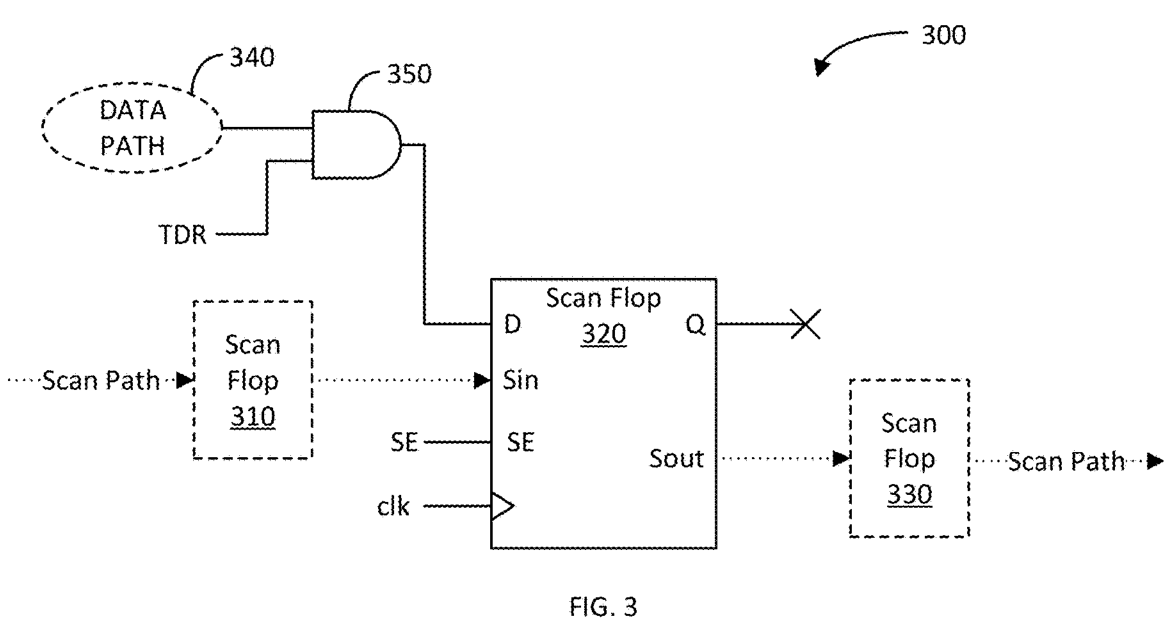
FIG. 3 illustrates a block diagram of an example integrated circuit (IC) including a single-bit, constant-0 flip-flop (F/F) reconfigured to provide an observable test point (TP) in accordance with another aspect of the disclosure.

FIG. 3 illustrates a block diagram of another example integrated circuit (IC) 300 in accordance with another aspect of the disclosure. As discussed in more detail further herein, the IC 300 includes a constant-0 flip-flop (F/F) reconfigured to provide a test point (TP) for observing an otherwise unobservable data path (e.g., a random pattern fault resistant data path).

In particular, the IC 300 includes a single-bit, constant-0 flip-flop (F/F) 320 (e.g., also referred to as a scan flop or sequential element). As previously discussed, the F/F 320 is referred to as a "constant-0" F/F because the functional path associated with the F/F 320 is disabled. In this regard, the constant-0 F/F 320 includes a data output (Q) that is unconnected (e.g., not connected to a functional circuit or logic), as indicated by the X at the end of a metal line extending from the data output (Q). With regard to the data input (D), additional circuitry is provided to include the additional feature of providing a test point (TP) for observing an otherwise unobservable data path, as discussed further herein.

Similarly, the constant-0 F/F 320 is placement aware and is part of a scan chain or path of the IC 300. For instance, the IC 300 includes a scan flop or F/F 310 preceding the constant-0 F/F 320 along a scan path. That is, the preceding F/F 310 includes a scan output (Sout) port coupled to a scan input (Sin) port of the constant-0 F/F 320. Similarly, the IC 300 may include a scan flop or F/F 330 following the constant-0 F/F 320 along the scan path. That is, the constant-0 F/F 320 includes an Sout port coupled to a Sin port of the following F/F 330.

The IC 300 further includes a data path 340 that would otherwise be unobservable (e.g., a random pattern fault resistant data path). For providing a test point (TP) to observe the data path 340, the IC 300 further includes an AND gate 350 including a first input coupled to the data path 340 and a second input configured to receive a test data register (TDR) signal. The AND gate 350 includes an output coupled to the data input (D) of the constant-0 F/F 320. Although the gate 350 is referred to as an AND gate, it shall be understood that any logic that is able to logically AND the signal or data on the data path 340 and the TDR signal, such as a NAND gate, qualifies as the AND gate 350.

Figure 5:
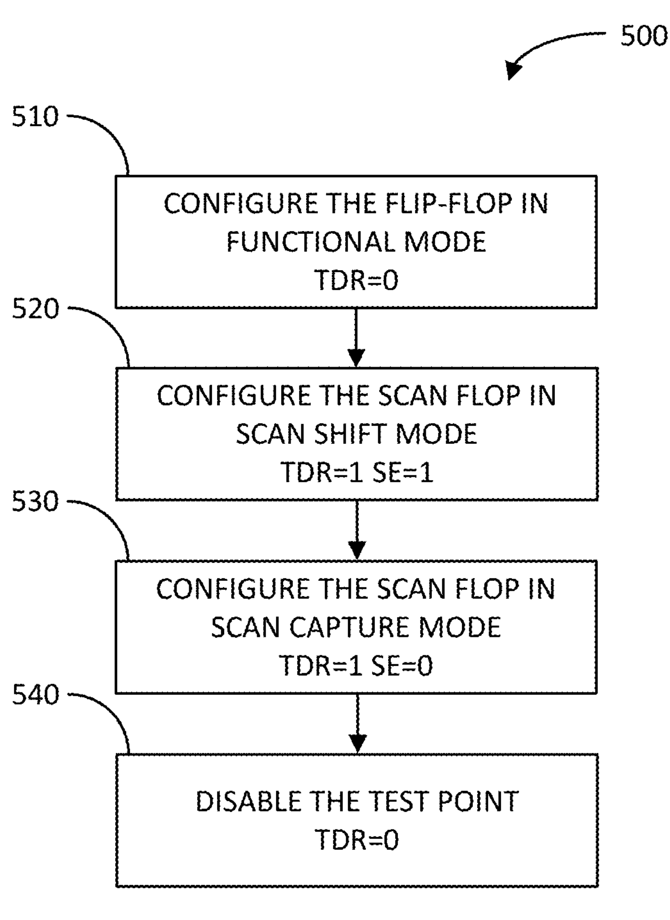
FIG. 5 illustrates a flow diagram of an example method of operating the integrated circuit (IC) of FIG. 3 or 4 in accordance with another aspect of the disclosure.

As discussed in more detail with respect to FIG. 5, when the TDR is asserted (e.g., TDR=1), the signal or data on the data path 340 is provided to the data input (D) of the constant-0 F/F 320. A scan test pattern signal and scan enable (se) signal may be provided to the Sout port to the constant-0 F/F 320 in accordance with the test script for observing the data or signal on the data path 340 clocked to the Sout port during scan capture mode. Further, as previously mentioned, the data input (D) may alternatively be tied to a logic “1” as in a constant-1 F/F. In such case, the AND gate 350 would be an OR gate (or any equivalent OR function gate) and the TDR signal would be asserted when it is a logic “0”.

Figure 4:
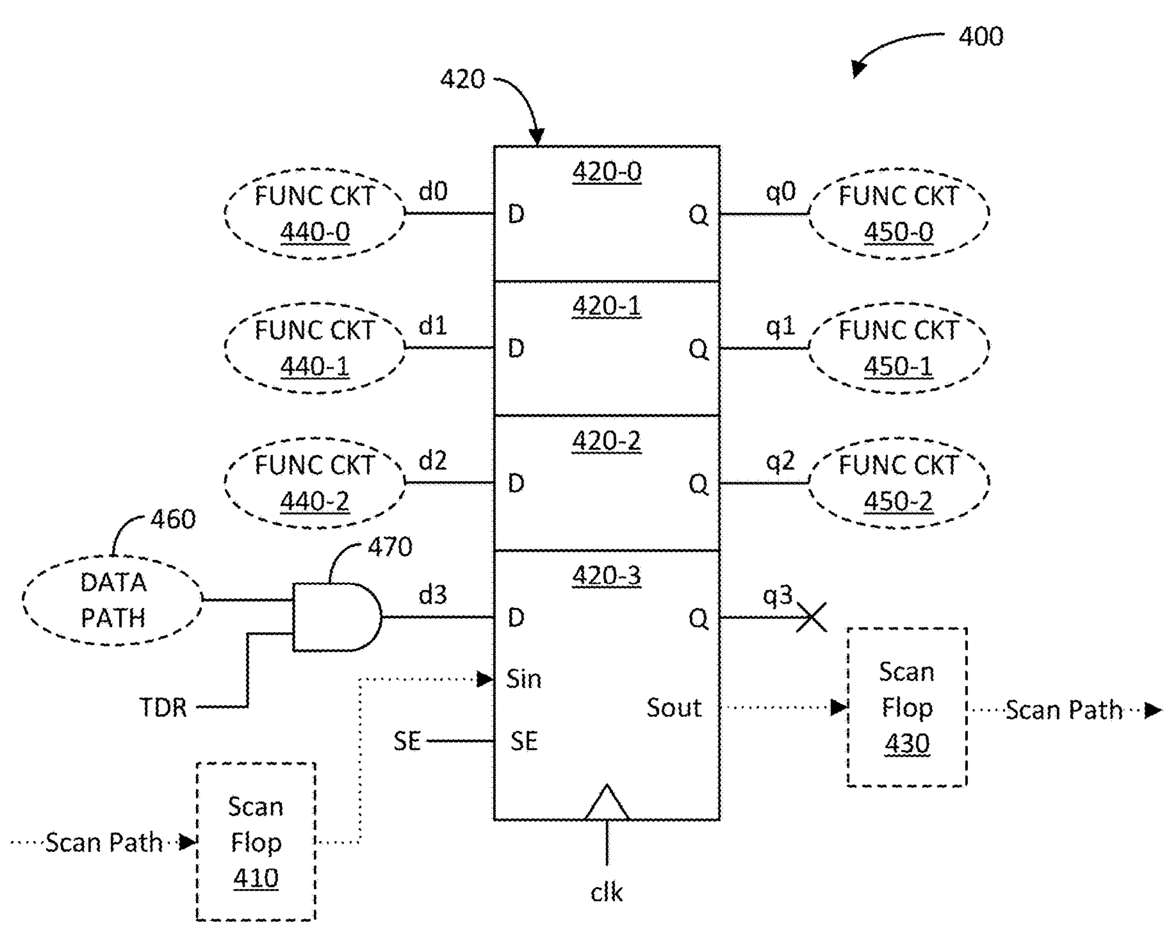
FIG. 4 illustrates a block diagram of an example integrated circuit (IC) including a flop tray with at least one constant-0 flip-flop (F/F) reconfigured to provide an observable test point (TP) in accordance with another aspect of the disclosure.

FIG. 4 illustrates a block diagram of another example integrated circuit (IC) 400 in accordance with another aspect of the disclosure. As discussed in more detail further herein, the IC 400 includes a flop tray with a constant-0 flip-flop (F/F) reconfigured to provide a test point (TP) for observing an otherwise unobservable data path (e.g., a random pattern fault resistant data path).

In particular, the IC 400 includes a flop tray 420 including a set of four (4) F/Fs 420-0 to 420-3 (although the flop tray 420 may have a different number (more or less) of F/Fs). In this example, three (3) of the F/Fs 420-0 to 420-2 are used in functional mode, and one (1) F/F is a constant-0 F/F 420-3. It shall be understood that the flop tray 420 may include more than one constant-0 F/F. The functional F/Fs 420-0 to 420-2 include data inputs (D) coupled to functional circuits (e.g., logic) 440-0 to 440-2 to receive therefrom data d0 to d2, respectively. The functional F/Fs 420-0 to 420-4 also include data inputs (Q) coupled to other functional circuits (e.g., logic) 450-0 to 450-2 to provide thereto data q0 to q2, respectively.

The constant-0 F/F 420-3 of the flop tray 420 includes a data input (D), which in functional mode is tied to a logic “0” (but could also be tied to a logic “1”). Likewise, the F/F 420-3 may also be referred to as a constant-x F/F of the flop tray 420. The constant-0 F/F 420-3 includes a data output (Q) that is unconnected (e.g., not connected to a functional circuit or logic), as indicated by the X at the end of a metal line extending from the data output (Q).

The flop tray 420 is placement aware and is part of a scan chain or path of the IC 400. For instance, the IC 400 may include a scan flop or F/F 410 preceding the flop tray 420 along a scan path. That is, the preceding F/F 410 includes a scan output (Sout) port coupled to a scan input (Sin) port of the flop tray 420. Similarly, the IC 400 may include a scan flop or F/F 430 following the flop tray 420 along the scan path. That is, the flop tray 420 includes an Sout port coupled to an Sin port of the following F/F 430.

The IC 400 further includes a data path 460 that would otherwise be unobservable (e.g., a random pattern fault resistant data path). For providing a test point (TP) to observe the data path 460, the IC 400 further includes an AND gate 470 including a first input coupled to the data path 460 and a second input configured to receive a test data register (TDR) signal. The AND gate 470 includes an output coupled to the data input (D) of the constant-0 F/F 420-3 of the flop tray 420. Although the gate 470 is referred to as an AND gate, it shall be understood that any logic that is able to logically AND a signal or data on the data path 460 and the TDR signal, such as a NAND gate, qualifies as the AND gate 470.

As discussed in more detail with respect to FIG. 5, when the TDR is asserted (e.g., TDR=1), the signal on the data path 460 is provided to the data input (D) of the constant-0 F/F 420-3 of the flop tray 420. A scan test pattern signal and scan enable (se) signal may be provided to the constant-0 F/F 420-3 to set the Sout signal in accordance with a test script. In scan capture mode, the signal or data on the data path 460 may be clocked to the Sout port for observability purpose. Further, as previously mentioned, the data input (D) of the constant-x F/F 420-3 may alternatively be tied to a logic “1” as in a constant-1 F/F. In such case, the AND gate 470 would be an OR gate (or any equivalent OR function gate) and the TDR signal would be asserted when it is a logic “0”.

FIG. 5 illustrates a flow diagram of an example method 500 of operating the integrated circuit (IC) 300 or 400 in accordance with another aspect of the disclosure. The method 500 is discussed with a constant-0 F/F instead of a constant-1 F/F for case of explanation. However, as previously discussed, the ICs 300 and 400 may use constant-1 F/Fs, where the AND gates coupled to the data inputs (D) of the constant-1 F/Fs are OR gates, and the TDR signal is asserted with a logic “0”.

The method 500 includes configuring the flip-flop (F/F) 320 or 420-3 in functional mode by generating a deasserted test data register (TDR) signal (e.g., TDR=0) (block 510). In this configuration, the AND gate 350 or 470 outputs a logic 0. Thus, the constant-0 flip-flop (F/F) 320 or 420-3 is configured as a constant-0 F/F because the data input (D) is tied to a logic 0, and the data output (Q) is not connected to any functional circuit or logic. The method 500 further includes configuring the F/F 320 or 420-3 in scan shift mode (e.g., TDR=1 and SE=1) (block 520). In this configuration, a test pattern may be propagated to the Sout port of the F/F 320 or 420-3 (in response to the clk signal) via the scan path in accordance with a test script.

The method 500 additionally includes configuring the flip-flop (F/F) 320 or 420-3 in scan capture mode (e.g., TDR=1 and SE=0) (block 530). In this configuration, the data on the now observable data path propagates to the scan path via the Sout port (in response to the clk signal) for observability purposes. Further, the method 500 includes disabling the test point (TP) (e.g., TDR=0) (block 540). This again reconfigures the F/F 320 or 420-3 as a constant-0 F/F with its data input (D) tied to logic 0.

Figure 6:
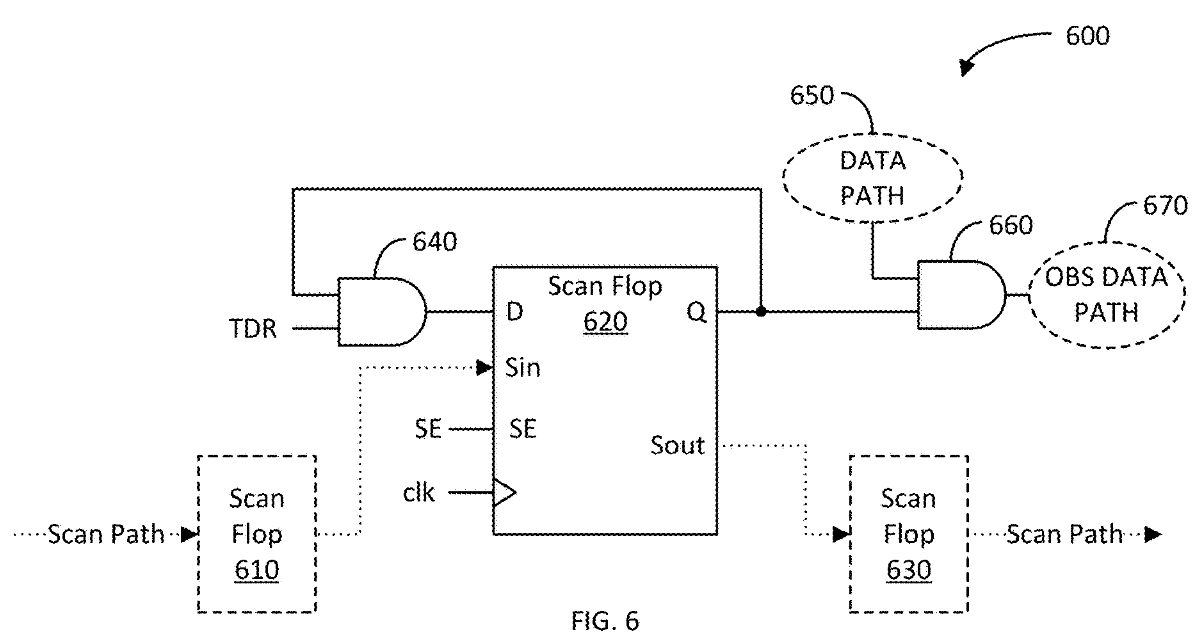
FIG. 6 illustrates a block diagram of an example integrated circuit (IC) including a single-bit, constant-0 flip-flop (F/F) reconfigured to provide a controllable test point (TP) in accordance with another aspect of the disclosure.

FIG. 6 illustrates a block diagram of another example integrated circuit (IC) 600 in accordance with another aspect of the disclosure. As discussed in more detail further herein, the IC 600 includes a constant-0 flip-flop (F/F) reconfigured to provide a controllable test point (TP) for selectively masking an otherwise unobservable data path (e.g., a random pattern fault resistant data path) to an observable data path.

In particular, the IC 600 includes a single-bit, constant-0 flip-flop (F/F) 620 (e.g., also referred to as a scan flop or sequential element). As previously discussed, the F/F 620 is referred to as a “constant-0” F/F because the functional path associated with the F/F 620 is disabled, and when a test data register (TDR) signal is not asserted, the data input (D) of the F/F 620 is tied to a logic 0 (but could also be tied to a logic “1”, as previously discussed). As discussed in more detail further herein, the constant-0 F/F 620 is reconfigured as a controllable test point (TP) to selectively mask a data path 650 from an observable data path 670.

The constant-0 F/F 620 is placement aware and is part of a scan chain or path of the IC 600. For instance, the IC 600 may include a scan flop or F/F 610 preceding the constant-0 F/F 620 along a scan path. That is, the preceding F/F 610 includes a scan output (Sout) port coupled to a scan input (Sin) port of the constant-0 F/F 620. Similarly, the IC 600 includes a scan flop or F/F 630 following the constant-0 F/F 620 along the scan path. That is, the constant-0 F/F 620 includes an Sout port coupled to a Sin port of the following F/F 630.

For providing a controllable test point (TP) to selectively mask the data path 650 from an observable data path 670, the IC 600 further includes a first AND gate 640 including a first input coupled to the data output (Q) of the constant-0 F/F 620, and a second input configured to receive a test data register (TDR) signal. The first AND gate 640 includes an output coupled to the data input (D) of the constant-0 F/F 620. Additionally, the IC 600 includes a second AND gate 660 including a first input coupled to the data output (Q) of the constant-0 F/F 620, a second input coupled to the data path 650, and an output coupled to the observable data path 670. The controllable TP operation of the IC 600 is discussed below with reference to a method described with reference to FIG. 7.

As with the other ICs, a constant-1 F/F may be employed by replacing the AND gates 640 and 660 with OR gates, and the TDR signal being a logic 0 when it is asserted. Accordingly, the constant-0 F/F 620 may more generally be referred to as a constant-x, where x is a bit value (e.g., a logic 0 or a logic 1) that is constant at the data input (D) of the constant-x F/F 620 when operated in functional mode or when the controllable test point (TP) is disabled (e.g., TDR=x). Furthermore, although the IC 600 includes a single-bit, constant-0 F/F 620 to implement the controllable TP operation, it shall be understood that the constant-0 F/F 620 may be part of a flop tray in a similar manner as constant-0 F/F 420-3 is part of flop tray 420.

Figure 7:
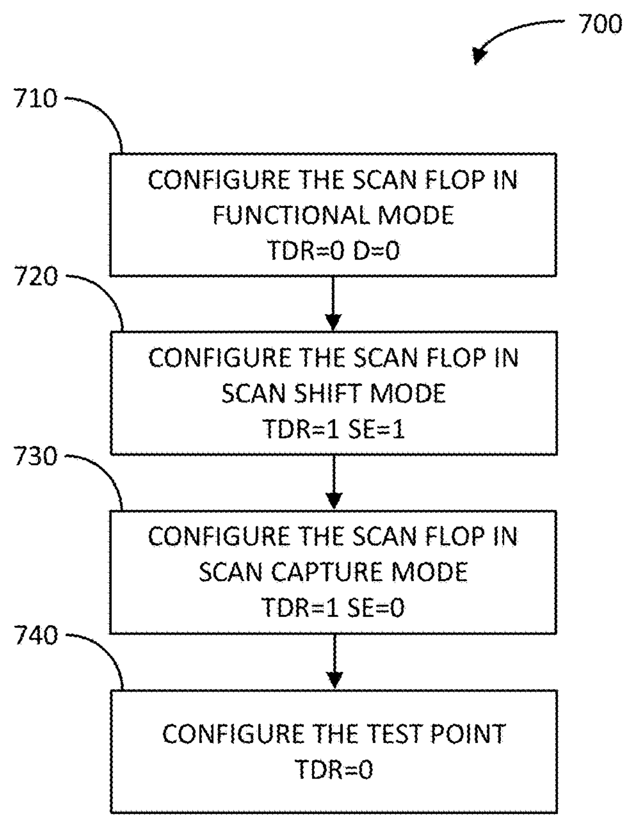
FIG. 7 illustrates a flow diagram of an example method of operating the integrated circuit (IC) of FIG. 6 in accordance with another aspect of the disclosure.

FIG. 7 illustrates a diagram of an example method 700 of operating the IC 600 in accordance with another aspect of the disclosure. The method 700 is discussed with reference to a constant-0 F/F instead of a constant-1 F/F for case of explanation. However, as previously discussed, the IC 600 may use a constant-1 F/F, where the AND gates 640 and 660 may be replaced with OR gates, and the TDR signal is asserted with a logic "0".

The method 700 includes configuring the constant-0 flip-flop (F/F) 620 in functional mode by generating a deasserted test data register (TDR) signal (e.g., TDR=0) (block 710). In this configuration, the AND gate 640 outputs a logic 0 for the data input (D) of the constant-0 F/F 620. Thus, the constant-0 F/F 620 is configured as a constant-0 F/F because the data input (D) is tied to a logic 0. The method 700 further includes configuring the F/F 620 in scan shift mode (e.g., TDR=1 and SE=1) (block 720). In this configuration, a bit value constraint (e.g., a logic 1 or 0) may be propagated to the data output (Q) of the F/F 620 in response to the clock (clk) signal.

The method 700 additionally includes configuring the F/F 620 in scan capture mode (e.g., TDR=1 and SE-0) (block 730). In this configuration, the bit value constraint at the data output (Q) is fed back to its data input (D) via the AND gate 640. For example, if the bit value constant is a logic 1, the data path 650 is coupled to the observable data path 670 via the AND gate 660. If the bit value constant is a logic 0, the data path 650 is masked from the observable data path 670 by the AND gate 660. Thus, the reconfigured constant-0 F/F 620 serves as a controllable test point (TP) for selectively masking the data path 650 from the observable data path 670. Further, the method 700 includes disabling the controllable test point (TP) (e.g., TDR=0) (block 740). This ties the data input (D) to a logic 0; thereby reconfiguring the F/F 620 as a constant-0 F/F.

Figure 8:
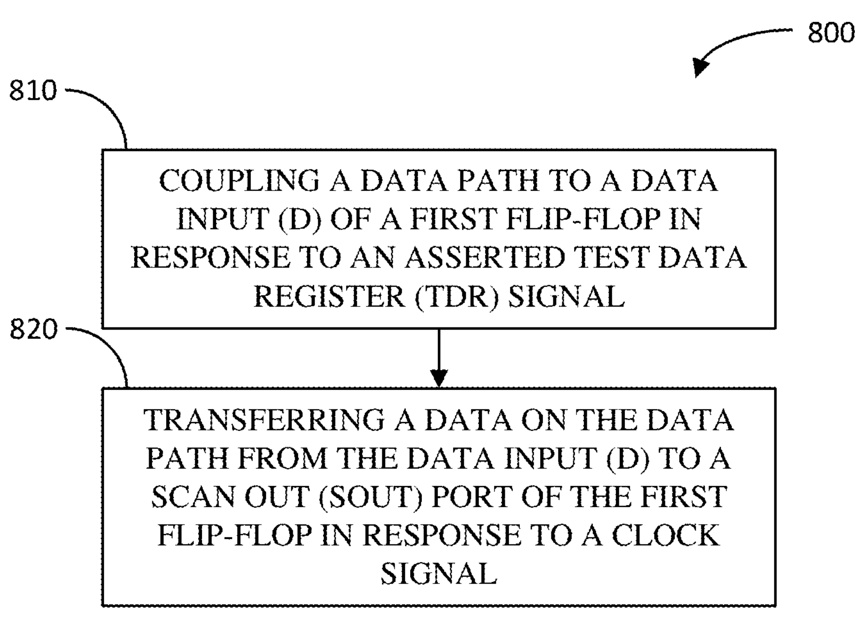
FIG. 8 illustrates a flow diagram of an example method of operating an integrated circuit (IC) in accordance with another aspect of the disclosure.

FIG. 8 illustrates a flow diagram of an example method 800 of operating an integrated circuit (IC) in accordance with another aspect of the disclosure. The method 800 includes coupling a data path to a data input (D) of a flip-flop in response to an asserted test data register (TDR) signal (block 810). The method 800 further includes transferring a data on the data path from the data input (D) to a scan out (Sout) port of the flip-flop in response to a clock signal (block 820).

Figure 9:
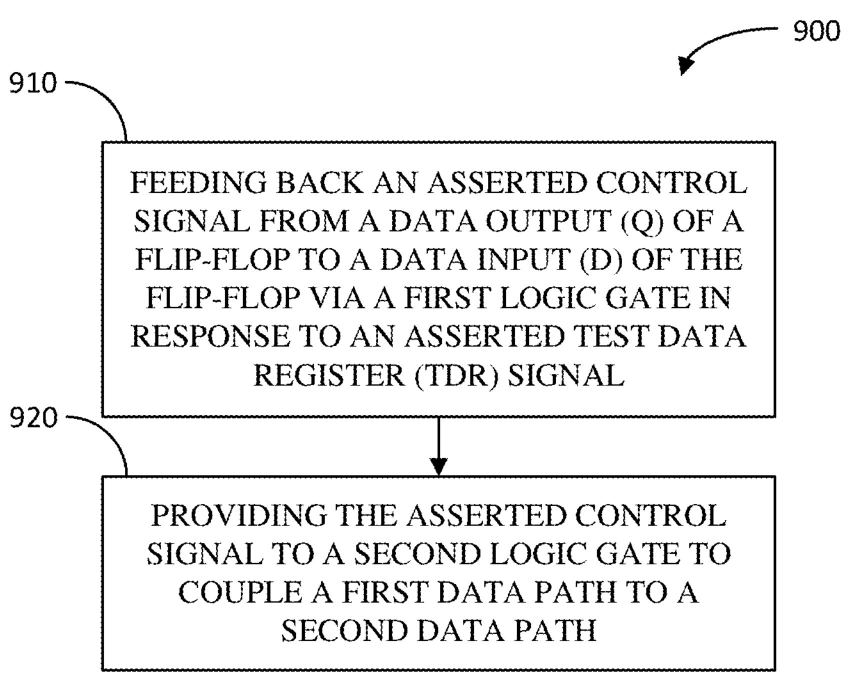
FIG. 9 illustrates a flow diagram of another example method of operating an integrated circuit (IC) in accordance with another aspect of the disclosure.

FIG. 9 illustrates a flow diagram of another example method 900 of operating an integrated circuit (IC) in accordance with another aspect of the disclosure. The method 900 includes feeding back an asserted control signal from a data output (Q) of a flip-flop to a data input (D) of the flip-flop via a first logic gate in response to an asserted test data register (TDR) signal (block 910). The method 900 further includes providing the asserted control signal to a second logic gate to couple a first data path to a second data path (block 920).

The following provides an overview of aspects of the present disclosure:

Aspect 1: An integrated circuit (IC), comprising: a data path; a logic gate including a first input coupled to the data path, and a second input configured to receive a test data register (TDR) signal; and a first flip-flop including a data input coupled to an output of the logic gate.

Aspect 2: The IC of aspect 1, wherein the first flip-flop includes a data output (Q) that is unconnected.

Aspect 3: The IC of aspect 1 or 2, wherein the logic gate comprises an AND gate.

Aspect 4: The IC of aspect 1 or 2, wherein the logic gate comprises an OR gate.

Aspect 5: The IC of any one of aspects 1-4, wherein the first flip-flop includes a scan in (Sin) port, and further comprising a second flip-flop including a scan out (Sout) port coupled to the Sin port of the first flip-flop.

Aspect 6: The IC of any one of aspects 1-5, wherein the first flip-flop includes a scan out (Sout) port, and further comprising a second flip-flop including a scan in (Sin) port coupled to the Sout port of the first flip-flop.

Aspect 7: The IC of any one of aspects 1-6, wherein the first flip-flop includes a scan enable (SE) port configured to receive a scan enable signal.

Aspect 8: The IC of any one of aspects 1-7, wherein the first flip-flop is among a set of flip-flops of a flop tray.

Aspect 9: The IC of aspect 8, wherein at least one of the set of flip-flops includes at least one data input (D) coupled to at least one functional circuit, respectively.

Aspect 10: The IC of aspect 8 or 9, wherein at least one of the set of flip-flops includes at least one data output (Q) coupled to at least one functional circuit, respectively.

Aspect 11: A method of operating an integrated circuit (IC), comprising: coupling a data path to a data input (D) of a flip-flop in response to an asserted test data register (TDR) signal; and transferring a data on the data path from the data input (D) to a scan out (Sout) port of the flip-flop in response to a clock signal.

Aspect 12: The method of aspect 11, wherein the first flip-flop includes a data output (Q) that is unconnected.

Aspect 13: The method of aspect 11 or 12, further comprising scanning in a test data to the Sout port of the first flip-flop prior to transferring the data on the data path to the Sout port.

Aspect 14: The method of any one of aspects 11-13, further comprising deasserting the TDR signal to decouple the data path from the data input (D) of the first flip-flop.

Aspect 15: The method of any one of aspects 11-14, wherein the first flip-flop is among a set of flip-flops of a flop tray.

Aspect 16: The method of aspect 15, wherein at least one of the set of flip-flops includes at least one data input (D) coupled to at least one functional circuit, respectively, and further comprising transferring at least one data from the at least one functional circuit to at least one data output (Q) of the at least one of the set of flip-flops when the TDR signal is deasserted and in response to a clock signal, respectively.

Aspect 17: The method of aspect 15 or 16, wherein at least one of the set of flip-flops includes at least one data output (Q) coupled to at least one functional circuit, respectively, and further comprising transferring at least one data from at least one data input of the at least one set of flip-flops to the at least one functional circuit when the TDR signal is deasserted and in response to a clock signal, respectively.

Aspect 18: An integrated circuit (IC), comprising: a first logic gate including a first input configured to receive a test data register (TDR) signal; a first flip-flop including a data input (D) coupled to an output of the first logic gate, and a data output (Q) coupled to a second input of the first logic gate; a first data path; and a second logic gate including a first input coupled to the data output of the first flip-flop and a second input coupled to the first data path.

Aspect 19: The IC of aspect 18, wherein the second logic gate includes an output coupled to a second data path.

Aspect 20: The IC of aspect 18 or 19, wherein each of the first and second logic gates comprises an AND gate.

Aspect 21: The IC of aspect 18 or 19, wherein each of the first and second logic gates comprises an OR gate.

Aspect 22: The IC of any one of aspects 18-21, wherein the first flip-flop includes a scan in (Sin) port, and further comprising a second flip-flop including a scan out (Sout) port coupled to the Sin port of the first flip-flop.

Aspect 23: The IC of any one of aspects 18-22, wherein the first flip-flop includes a scan out (Sout) port, and further comprising a second flip-flop including a scan in (Sin) port coupled to the Sout port of the first flip-flop.

Aspect 24: The IC of any one of aspects 18-23, wherein the first flip-flop includes a scan enable (SE) port configured to receive a scan enable signal.

Aspect 25: The IC of any one of aspects 18-24, wherein the first flip-flop is among a set of flip-flops of a flop tray.

Aspect 26: The IC of aspect 25, wherein at least one of the set of flip-flops includes at least one data input (D) coupled to at least one functional circuit, respectively.

Aspect 27: The IC of aspect 25, wherein at least one of the set of flip-flops includes at least one data output (Q) coupled to at least one functional circuit, respectively.

Aspect 28: A method of operating an integrated circuit (IC), comprising: feeding back an asserted control signal from a data output (Q) of a flip-flop to a data input (D) of the flip-flop via a first logic gate in response to an asserted test data register (TDR) signal; and providing the asserted control signal to a second logic gate to couple a first data path to a second data path.

Aspect 29: The method of aspect 28, further comprising scanning in the asserted control signal from a scan in (Sin) port of the flip-flop to the data output (Q) of the flip-flop.

Aspect 30: The method of aspect 28 or 29, further comprising deasserting the TDR signal to generate a deasserted control signal at the data output (Q) of the flip-flop to mask the first data path from the second data path via the second logic gate.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:

a first logic gate including a first input configured to receive a test data register (TDR) signal;

a first flip-flop including a data input (D) coupled to an output of the first logic gate, and a data output (Q) coupled to a second input of the first logic gate;

a first data path; and a second logic gate including a first input coupled to the data output of the first flip-flop and a second input coupled to the first data path.

2. The IC of claim 1, wherein the second logic gate includes an output coupled to a second data path.

3. The IC of claim 1, wherein each of the first and second logic gates comprises an AND gate.

4. The IC of claim 1, wherein each of the first and second logic gates comprises an OR gate.

5. The IC of claim 1, wherein the first flip-flop includes a scan in (Sin) port, and further comprising a second flip-flop including a scan out (Sout) port coupled to the Sin port of the first flip-flop.

6. The IC of claim 1, wherein the first flip-flop includes a scan out (Sout) port, and further comprising a second flip-flop including a scan in (Sin) port coupled to the Sout port of the first flip-flop.

7. The IC of claim 1, wherein the first flip-flop includes a scan enable (SE) port configured to receive a scan enable signal.

8. The IC of claim 1, wherein the first flip-flop is among a set of flip-flops of a flop tray.

9. The IC of claim 8, wherein at least one of the set of flip-flops includes at least one data input (D) coupled to at least one functional circuit, respectively.

10. The IC of claim 8, wherein at least one of the set of flip-flops includes at least one data output (Q) coupled to at least one functional circuit, respectively.

* * * * *